(12) United States Patent
Lee

(10) Patent No.: US 10,156,919 B2
(45) Date of Patent: Dec. 18, 2018

(54) IN-CELL TOUCH DISPLAY STRUCTURE

(71) Applicant: SuperC-Touch Corporation, New Taipei (TW)

(72) Inventor: Hsiang-Yu Lee, New Taipei (TW)

(73) Assignee: SUPERC-TOUCH CORPORATION, New Taipei (TW)

( * ) Notice: Subject to any disclaimer, the term of this patent is extended or adjusted under 35 U.S.C. 154(b) by 153 days.

(21) Appl. No.: 15/441,951

(22) Filed: Feb. 24, 2017

(65) Prior Publication Data

US 2017/0168627 A1    Jun. 15, 2017

Related U.S. Application Data

(62) Division of application No. 14/493,784, filed on Sep. 23, 2014, now Pat. No. 9,639,194.

(30) Foreign Application Priority Data

Sep. 24, 2013  (TW) .............................. 102217826 U

(51) Int. Cl.
```
G02F 1/1333      (2006.01)
G06F 3/041       (2006.01)
H01L 27/12       (2006.01)
H01L 27/32       (2006.01)
```
(52) U.S. Cl.
CPC ........ *G06F 3/0412* (2013.01); *G02F 1/13338* (2013.01); *H01L 27/124* (2013.01); *H01L 27/323* (2013.01); *H01L 27/3276* (2013.01)

(58) Field of Classification Search
CPC ...... G06F 3/0412; G06F 3/044; G06F 3/0416; H01L 27/323; H01L 27/3248; G02F 1/13338
See application file for complete search history.

(56) References Cited

U.S. PATENT DOCUMENTS

| | | | |
|---|---|---|---|
| 9,639,192 B2* | 5/2017 | Huang ................. | G06F 3/0418 |
| 2009/0322702 A1 | 12/2009 | Chien et al. | |
| 2013/0314369 A1* | 11/2013 | Liu ....................... | G06F 3/0412 |
| | | | 345/174 |
| 2013/0314371 A1* | 11/2013 | Lee ....................... | G06F 3/0412 |
| | | | 345/174 |
| 2014/0078414 A1 | 3/2014 | Lee | |
| 2014/0098056 A1 | 4/2014 | Huang et al. | |
| 2015/0042612 A1 | 2/2015 | Lee | |
| 2015/0085208 A1 | 3/2015 | Lee | |
| 2016/0085364 A1 | 3/2016 | Lee | |

* cited by examiner

*Primary Examiner* — Huyen Ngo
(74) *Attorney, Agent, or Firm* — Muncy, Geissler, Olds & Lowe, P.C.

(57) ABSTRACT

An in-cell touch display structure includes: an upper substrate, a lower substrate, a display material layer configured between the upper and lower substrates, and a thin film transistor and sensing electrode layer. The thin film transistor and sensing electrode layer includes a gate line sub-layer having a plurality of gate lines and a plurality of connection segments separated by the gate lines, and a source line sub-layer having a plurality of source lines, a plurality of sensing conductor lines, and a plurality of sensing conductor segments separated by the source lines and the sensing conductor lines, wherein part of the sensing conductor segments and part of the connection segments are electrically connected together to form a plurality of sensing conductor blocks.

10 Claims, 14 Drawing Sheets

IN-CELL TOUCH DISPLAY STRUCTURE

CROSS REFERENCE TO RELATED APPLICATION

This application is a divisional application of U.S. patent application Ser. No. 14/493,784, filed on Sep. 23, 2014, which claims the benefits of the Taiwan Patent Application Serial Number 102217826, filed on Sep. 24, 2013, the subject matter of which is incorporated herein by reference.

BACKGROUND OF THE INVENTION

1. Field of the Invention

The present invention relates to a display screen structure with a touch panel and, more particularly, to an in-cell touch display structure.

2. Description of Related Art

Modern consumer electronic apparatuses are typically equipped with touch panels for use as their input devices. According to different sensing manners, the touch panels can be classified into resistive type, capacitive type, acoustic type, and optical type.

The conventional touch display panel includes a touch panel and a display unit overlapped with the touch panel. The touch panel is configured as an operation interface. The touch panel is transparent so that an image generated by the display unit can be viewed directly by a user without being sheltered by the touch panel. Such well known skill of the touch panel may increase additional weight and thickness of the touch display panel, and may further reduce the light penetration rate, and increase reflectance and haze of the touch display panel.

On-cell and in-cell touch technology were invented to overcome the drawbacks of traditional touch technology described above. The on-cell technology is to dispose a sensor on the back side of a color filter substrate to form a completed color filter substrate. One of the on-cell touch technologies is provided to dispose a touch sensor on a thin film and then bond the thin film onto the upper one of the two substrates.

The on-cell technology is to dispose the sensor within the LCD cell structure. Currently, there are resistive, capacitive and optical three primary in-cell touch technologies, wherein the resistive touch technology employs two conductive substrates and the voltage variation of a common layer between the two substrates for determining a touch position on the touch display panel.

The in-cell touch technology is provided to integrate the touch sensor within the display unit so that the display unit is provided with the ability of the touch panel. Therefore, the touch display panel does not need to be bonded with an additional touch panel so as to simplify the assembly procedure. Such skill is generally developed by TFT LCD manufactures.

There is older touch control technology known as out-cell, which is typically applied to the resistive and capacitive touch panels. The out-cell touch technology is provided to add a touch module onto a display module. The touch module and the display module can be manufactured by the two separated parties.

However, for all the in-cell, on-cell and out-cell touch technologies, they all need a sensing layer made of ITO material to be configured on an upper or lower glass substrate, which not only increases the manufacturing cost but also lowers the yield rate and complicates the manufacturing process. Moreover, due to a low aperture rate, strong backlight is required, resulting in higher power consumption, which is disadvantageous in developing mobile devices with low power consumption. Therefore, it desired for the aforementioned touch display panel structure to be improved.

SUMMARY OF THE INVENTION

The object of the present invention is to provide an in-cell touch display panel structure for greatly saving the material cost and processing cost. Because there is no need to provide a sensing electrode layer made of ITO material on the upper substrate or lower substrate of a display panel, the manufacturing cost can be reduced and the manufacturing process can be simplified.

In one aspect of the present invention, there is provided an in-cell touch display structure, which comprises: an upper substrate; a lower substrate parallel to the upper substrate; a display material layer configured between the upper substrate and the lower substrate; a thin film transistor and sensing electrode layer arranged on one side of the lower substrate facing the display material layer, wherein the thin film transistor and sensing electrode layer includes: a gate line sub-layer having a plurality of gate lines arranged in a first direction and a plurality of connection segments arranged in a second direction, the plurality of connection segments arranged in the second direction being separated by the plurality of gate lines; and a source line sub-layer disposed at one side of the gate line sub-layer facing the display material layer and having a plurality of source lines arranged in the second direction, a plurality of sensing conductor lines arranged in the second direction and in parallel with the plurality of source lines, and a plurality of sensing conductor segments arranged in the first direction, the plurality of sensing conductor segments arranged in the first direction being separated by the plurality of source lines and the plurality of sensing conductor lines, wherein part of the sensing conductor segments and part of the connection segments are electrically connected together to form a plurality of sensing conductor blocks arranged in the first direction.

In another aspect of the present invention, there is provided an in-cell touch display structure, which comprises: an upper substrate; a lower substrate parallel to the upper substrate; a display material layer configured between the upper substrate and the lower substrate; a thin film transistor and sensing electrode layer arranged on one side of the lower substrate facing the display material layer for driving a corresponding pixel driving circuit based on a display pixel signal and a display driving signal, wherein the thin film transistor and sensing electrode layer includes: a gate line sub-layer having a plurality of gate lines arranged in a first direction, a plurality of sensing conductor lines arranged in the first direction and in parallel with the plurality of gate liens, and a plurality of sensing conductor segments arranged in a second direction, the plurality of sensing conductor segments arranged in the second direction being separated by the plurality of gate lines and the plurality of sensing conductor lies; and a source line sub-layer arranged at one side of the gate line sub-layer facing the display material layer and having a plurality of source lines arranged in the second direction and a plurality of connection segments arranged in the first direction, the plurality of connection segments arranged in the first direction being separated by the plurality of source lines, wherein part of the sensing conductor segments and part of the connection segments are electrically connected together to form a plurality of sensing conductor blocks arranged in the second direction.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
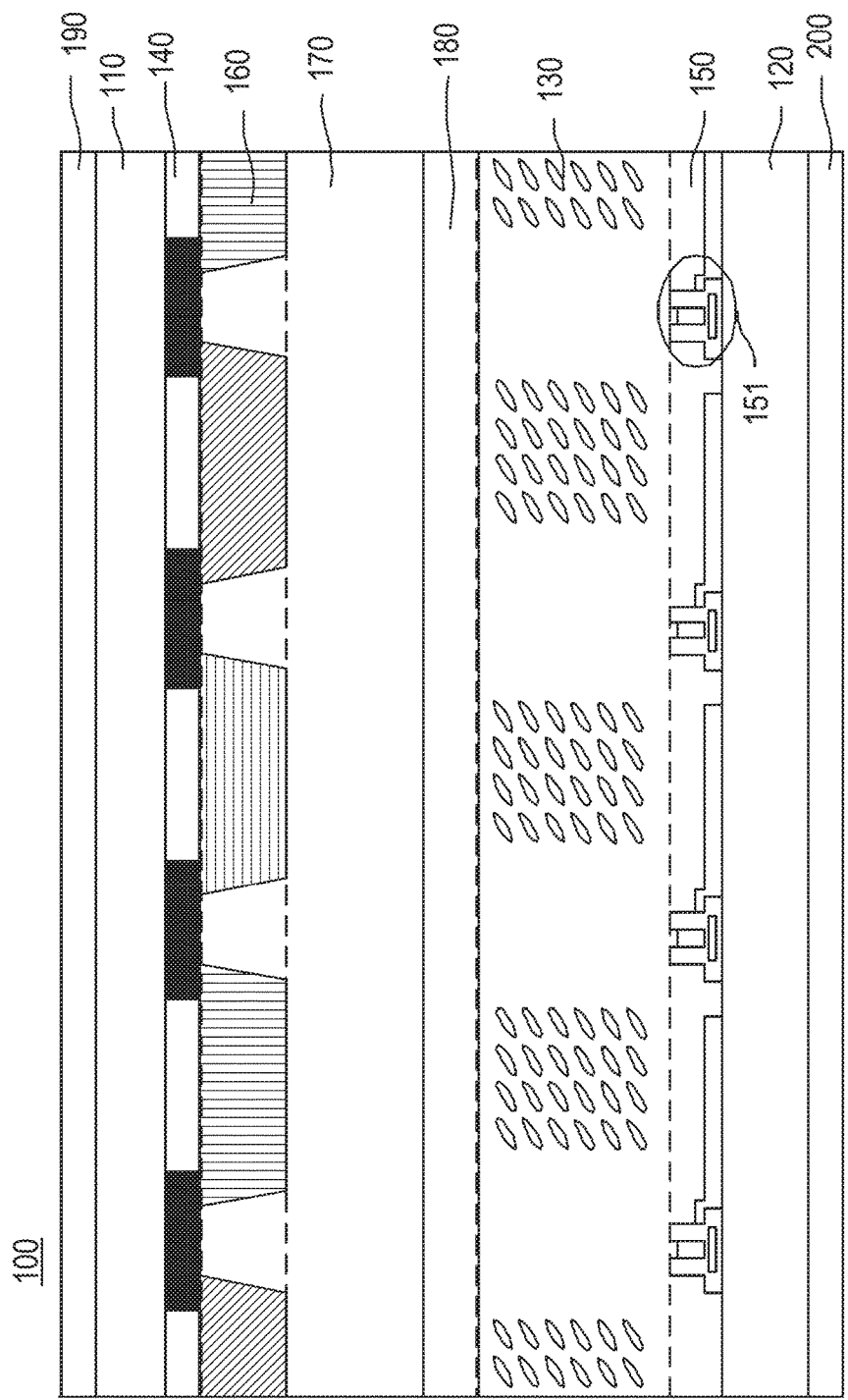
FIG. 1 is a stack-up diagram of an in-cell touch display structure in accordance with one embodiment of the present invention.

With reference to FIG. 1, there is shown a stack-up diagram of an in-cell touch display structure in accordance with one embodiment of the present invention. As shown, the in-cell touch display structure 100 includes an upper substrate 110, a lower substrate 120, a display material layer 130, a black matrix layer 140, a thin film transistor and sensing electrode layer 150, a color filter layer 160, an over coat layer 170, a common electrode (Vcom) layer 180, an upper polarizer layer 190, and a lower polarizer layer 200.

The upper substrate 110 and the lower substrate 120 are preferably glass substrates, and are parallel to each other. The display material layer 130 is disposed between the upper and lower substrates 110, 120. In this embodiment, the display material layer 130 is a liquid crystal layer.

The black matrix layer 140 is between the upper substrate 110 and liquid crystal layer 130 and is disposed at one side of the upper substrate 110 that faces the display material layer 130. The black matrix layer 140 is composed of a plurality of opaque lines.

Figure 2:
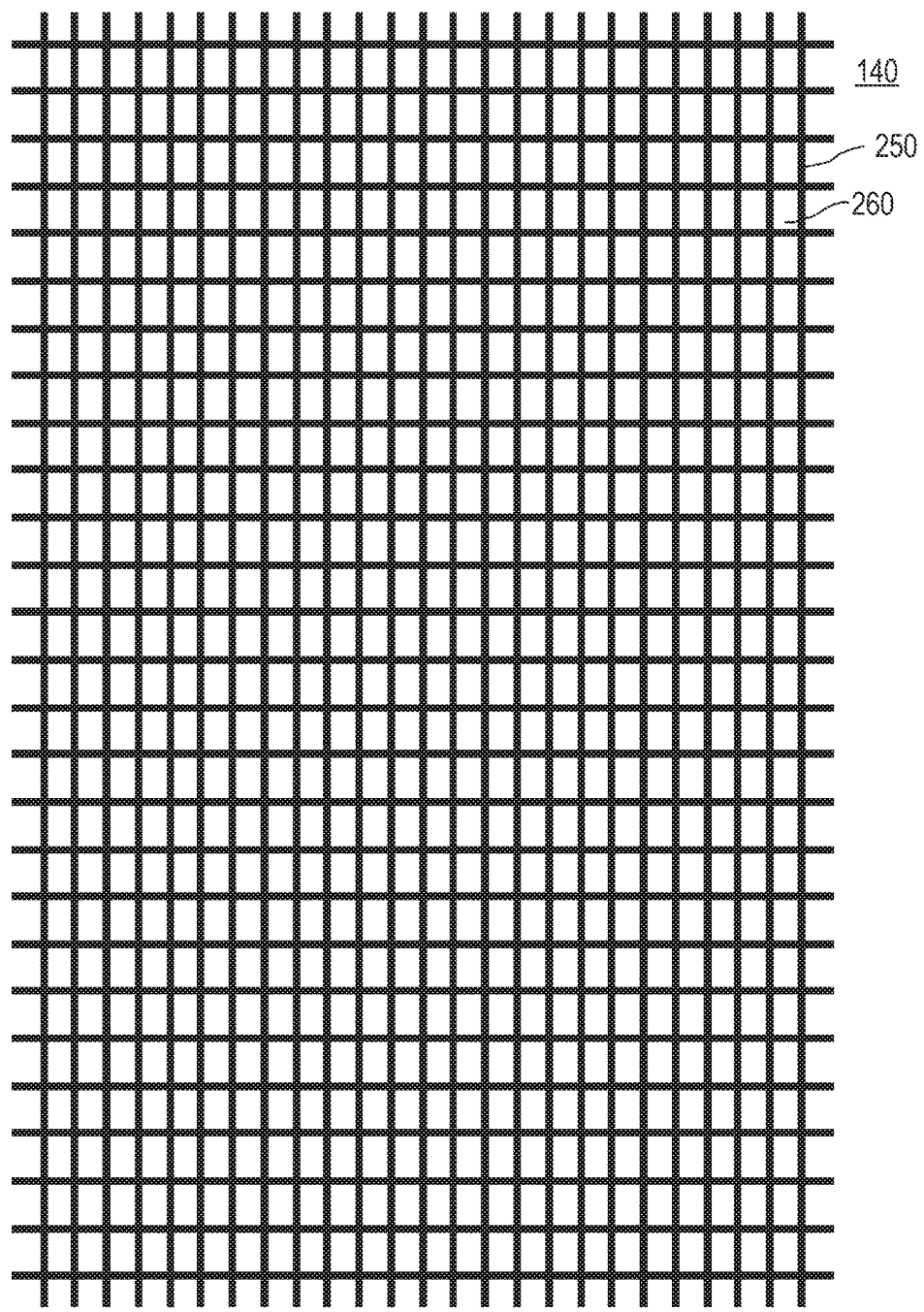
FIG. 2 shows the black matrix layer of the in-cell touch display structure in accordance with the present invention.

FIG. 2 shows the black matrix layer 140, which is the same as that of the prior LCD panel. As shown in FIG. 2, the black matrix layer 140 is composed of a plurality of opaque lines 250 of insulating material that are black and opaque. The plurality of lines 250 of black insulating material are arranged as a checkerboard pattern and the color filter is disposed at the spaces 260 among those opaque lines 250 of black insulating material.

In prior LCD panel structure, the thin film transistor layer is between the lower substrate (120) and the display material layer (130) and is disposed at one surface of the lower substrate (120) that faces the display material layer (130). The prior thin film transistor layer is composed of thin film transistors (151) and transparent electrodes.

In the present invention, a plurality of sensing conductor lines, a plurality of sensing conductor segments and a plurality of connection segments are provided on the prior thin film transistor layer, wherein part of the plurality of sensing conductor segments is electrically connected to part of the plurality of connection segments to form a plurality of sensing conductor blocks arranged in a first direction (X-axis direction), and a plurality of sensing conductor lines are provided to form a plurality of sensing conductor lines arranged in a second direction (Y-axis direction), thereby forming the thin film transistor and sensing electrode layer 150 in accordance with the present invention. Therefore, there is no need to arrange a sensing electrode layer of transparent conductive material on the upper glass substrate or the lower glass substrate of an LCD display panel, so as to reduce the manufacturing cost, simplify the manufacturing process and increase the yield rate. The thin film transistor and sensing electrode layer 150 is between the lower substrate 120 and the display material layer 130 and is disposed at one surface of the lower substrate 120 that faces the display material layer 130. Furthermore, the thin film transistor and sensing electrode layer 150 includes a gate line sub-layer and a source line sub-layer.

Figure 3:
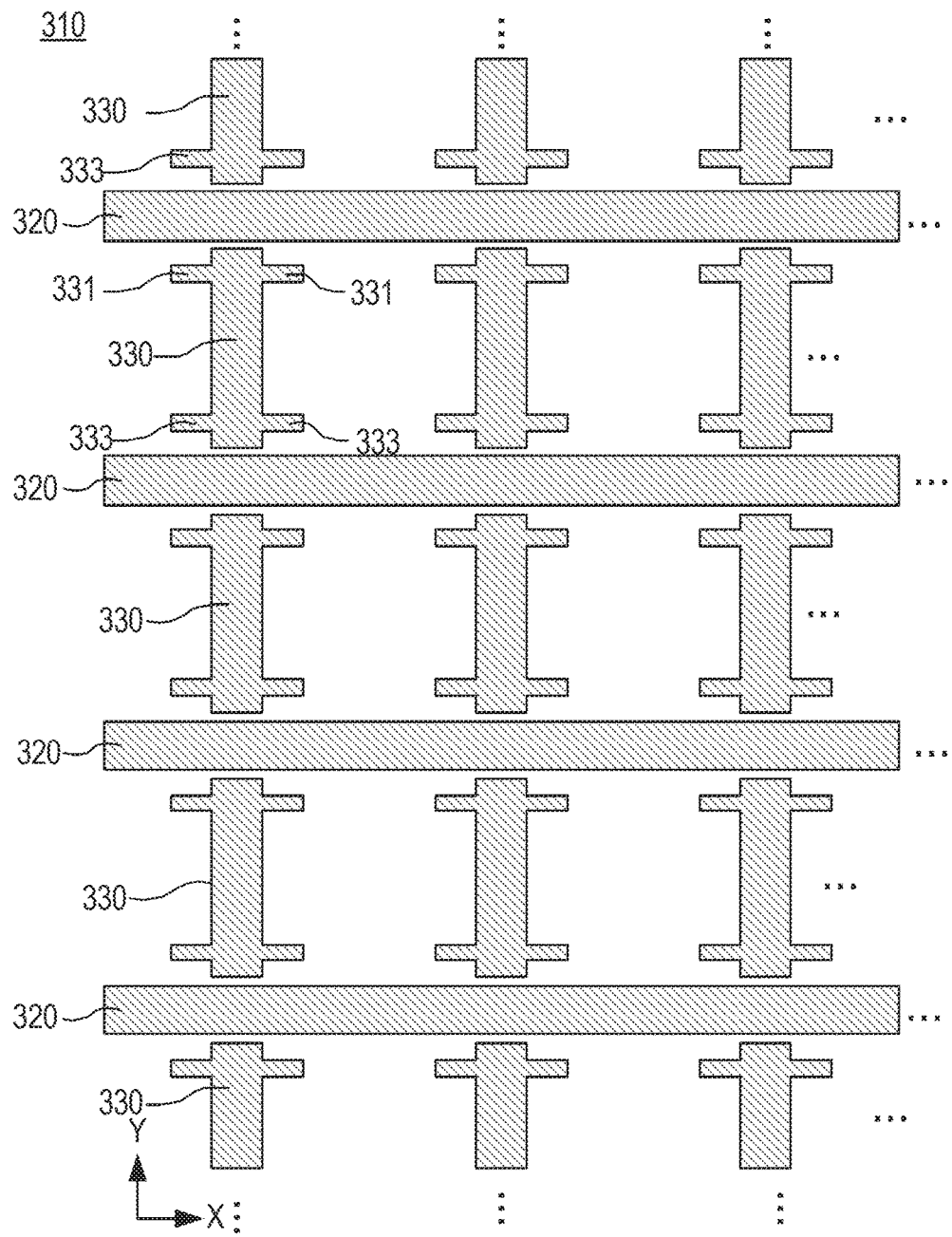
FIG. 3 is a schematic diagram of the gate line sub-layer of the in-cell touch display structure in accordance with the present invention.

FIG. 3 is a schematic diagram of the gate line sub-layer 310 in accordance with the present invention. The gate line sub-layer 310 has a plurality of gate lines 320 and a plurality of connection segments 330. The plurality of gate lines 320 are arranged in the first direction (X-axis direction) and the plurality of connection segments 330 are arranged in the second direction (Y-axis direction), wherein the plurality of connection segments 330 arranged in the second direction are separated by the plurality of gate lines 320. Each of the plurality of connection segments 330 arranged in the second direction includes two ends respectively having a first extension part 331 and a second extension part 333 arranged in the first direction and extended toward two sides of the connection segment 330, in which the first direction is substantially vertical to the second direction.

Figure 4:
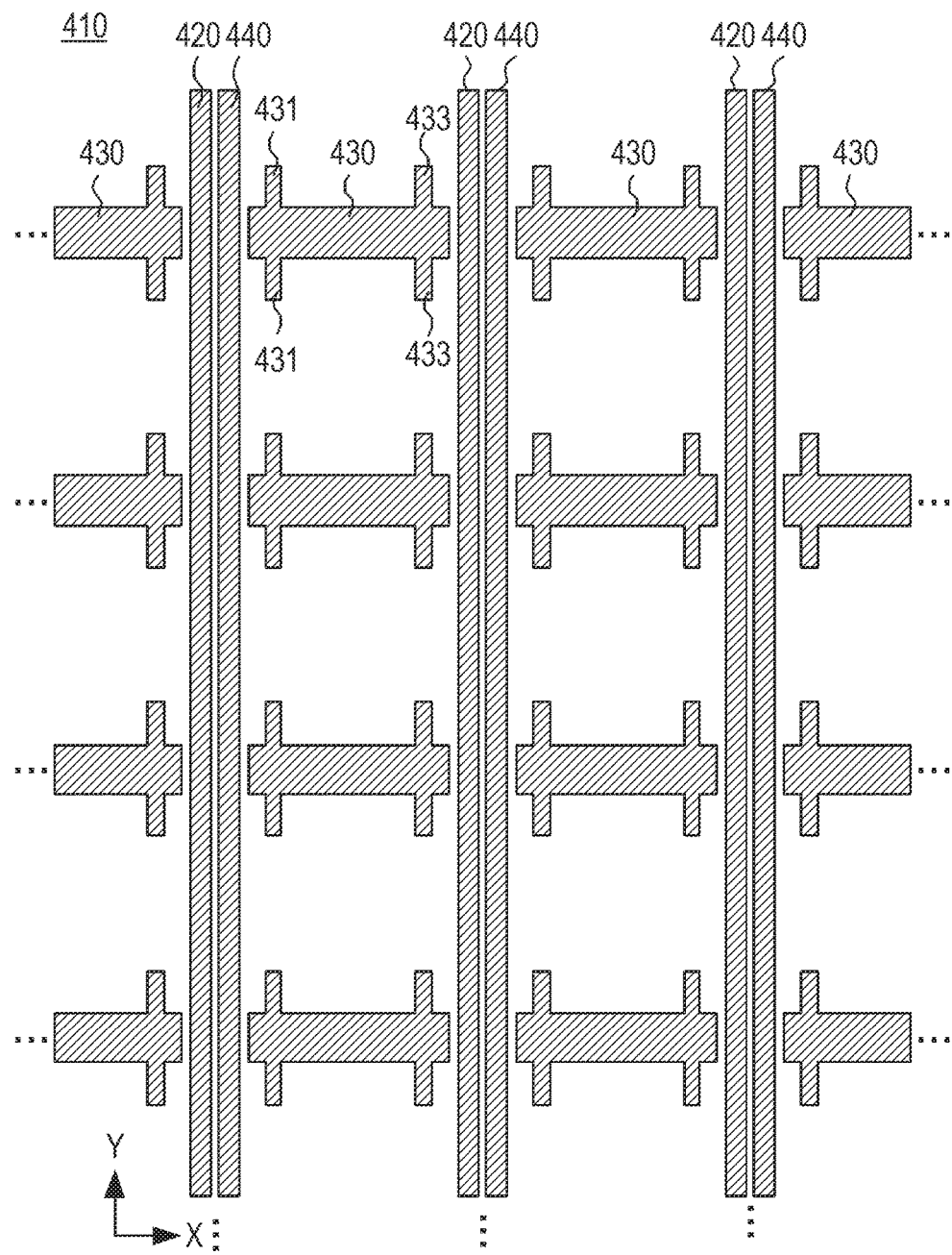
FIG. 4 is a schematic diagram of the source line sub-layer of the in-cell touch display structure in accordance with the present invention.

FIG. 4 is a schematic diagram of the source line sub-layer 410 in accordance with the present invention. The source line sub-layer 410 is disposed at one side of the gate line sub-layer 310 facing the display material layer 130 and has a plurality of source lines 420, a plurality of sensing conductor segments 430, and a plurality of sensing conductor lines 440. The plurality of source lines 420 are arranged in the second direction (Y-axis direction). The plurality of sensing conductor lines 440 are arranged in the second direction and in parallel with the plurality of source lines 420. The plurality of sensing conductor segments 430 are arranged in the first direction. The plurality of sensing conductor segments 430 arranged in the first direction are separated by the plurality of source lines 420 and the plurality of sensing conductor lines 440. Each of the plurality of sensing conductor segments 430 arranged in the first direction includes two ends respectively having a first extension part 431 and a second extension part 433 arranged in the second direction and extended toward two sides of the sensing conductor segment 430.

The plurality of sensing conductor segments 430 and the plurality of connection segments 330 are disposed at positions corresponding to the positions of the plurality of gate lines 320, and the plurality of source lines 420 and the plurality of sensing conductor lines 440. Part of the sensing conductor segments 430 and part of the connection segments 330 are electrically connected by overlapping and electrically connecting the extension parts 331, 333, 431, 433 selectively, so as to form a plurality of sensing conductor blocks, as shown in FIG. 5, arranged in the first direction, wherein each sensing conductor block is a mesh-like quadrangular region and the quadrangular region is preferably of a rectangle.

Figure 5:
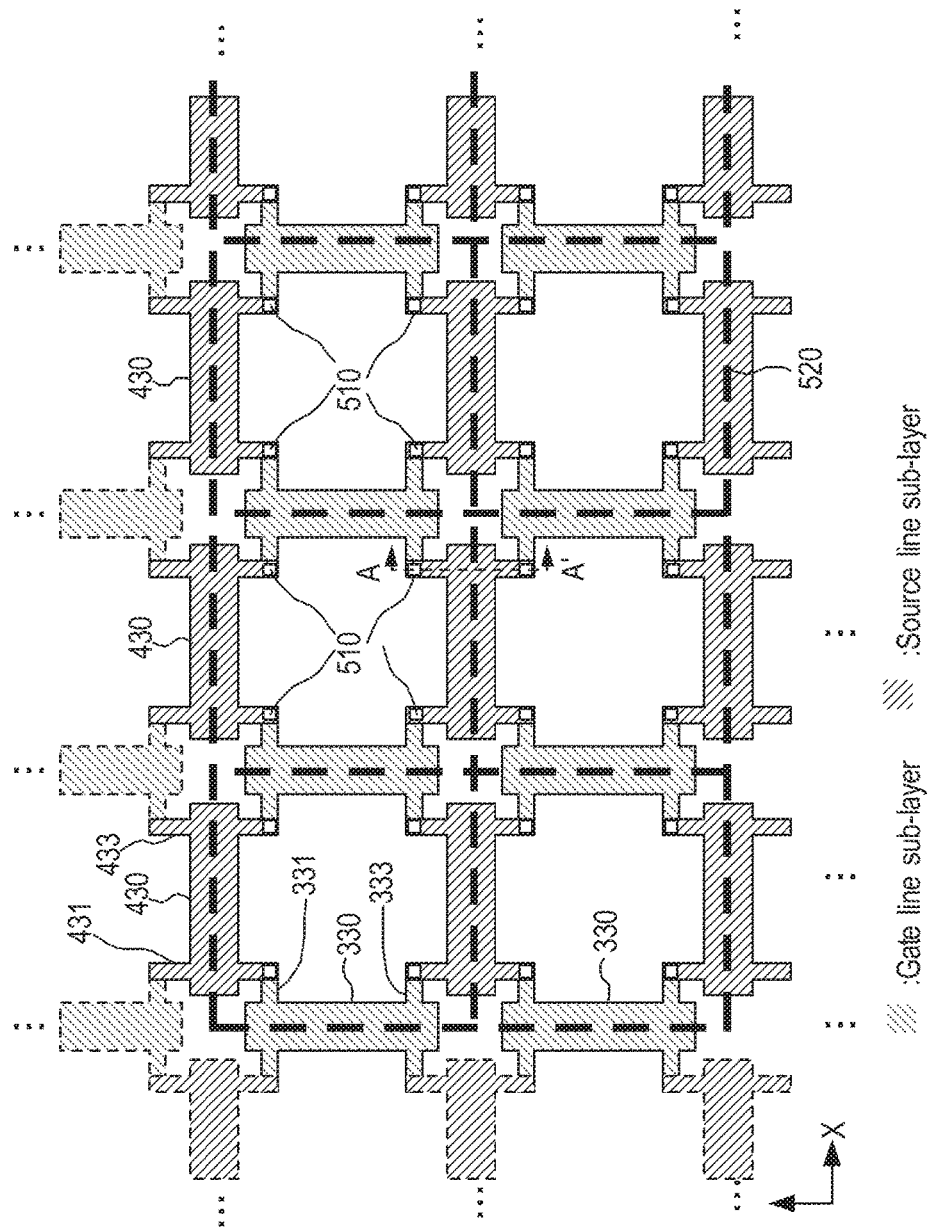
FIG. 5 schematically illustrates the electrical connection between the plurality of sensing conductor segments and the plurality of connection segments in accordance with the present invention.

FIG. 5 schematically illustrates the electrical connection between the plurality of sensing conductor segments 430 and the plurality of connection segments 330. The connection segments 330 and the sensing conductor segments 430 are disposed at different layers, respectively, wherein the extension parts 331, 333, 431, 433 are partially overlapped and can be electrically connected through via 510, so as to form a plurality of sensing conductor blocks 520 arranged in the first direction.

The plurality of connection segments 330 and the plurality of sensing conductor segments 430 are made of conductive metal material, wherein the conductive metal material is selectively to be chromium, barium, aluminum, silver, copper, titanium, nickel, tantalum, cobalt, tungsten, magnesium, calcium, potassium, lithium, indium, or a mixture of LiF, MgF2 or Li2O.

Figure 6:
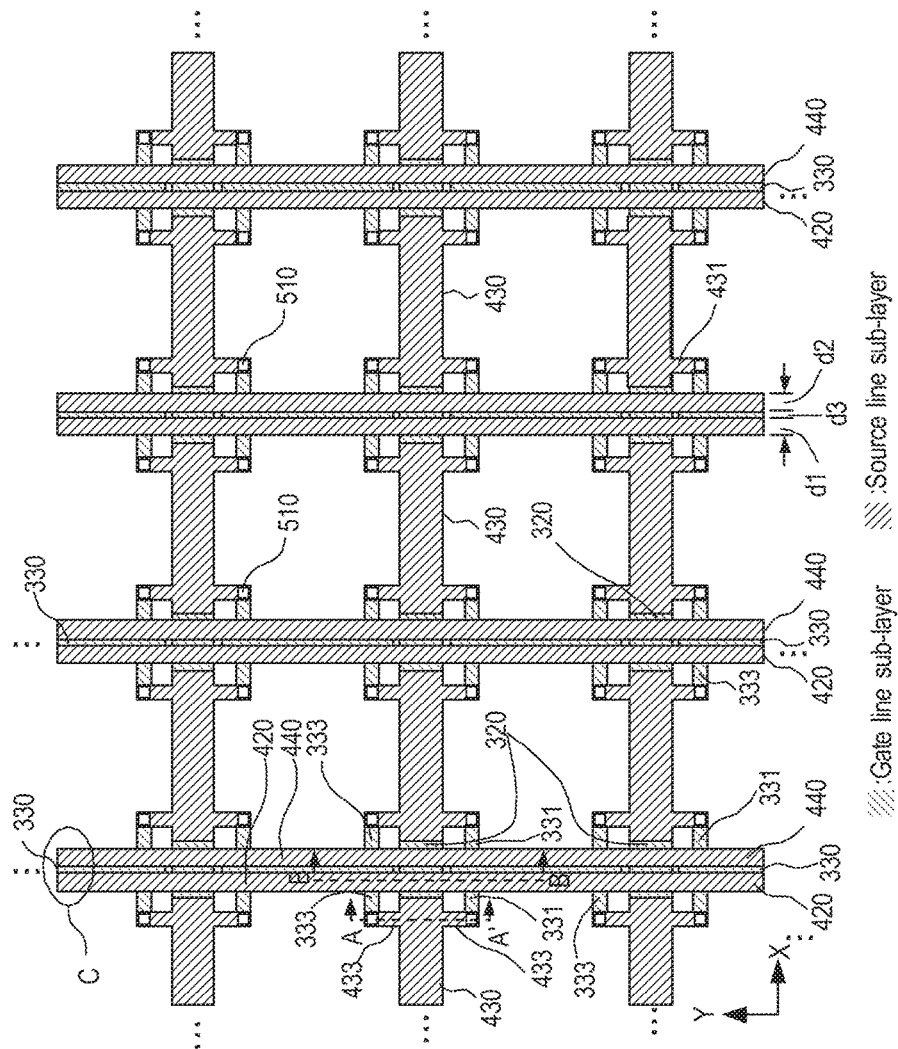
FIG. 6 schematically illustrates the electrical connection between the gate line sub-layer and the source line sub-layer in accordance with the present invention.

FIG. 6 schematically illustrates the electrical connection between the gate line sub-layer 310 and the source line sub-layer 410, which is viewed from the upper substrate 110 to the lower substrate 120. As shown in FIG. 6, the line width of the sensing conductor segment 430 arranged in the first direction is equal to the line width of the gate line 320, and the line width of the connection segment 330 arranged in the second direction is equal to the summation of the line width (d1) of the source line 420, the line width (d2) of the sensing conductor line 440 and a gap (d3) between the source line 420 and the sensing conductor line 440. It is noted that, at the place labeled by the ellipse C, the connection segment 330 can be seen as there is a gap (d3) between the source line 420 and the sensing conductor line 440.

In the present display structure, the plurality of opaque lines 250 of the black matrix layer 140 are disposed at positions corresponding to the positions of the plurality of gate lines 320 and the plurality of source lines 420, so that the plurality of opaque lines 250 of the black matrix layer 140 can shield the plurality of gate lines 320, the plurality of source lines 420 and the plurality of sensing conductor lines 440. In other embodiments, the line width of the sensing conductor segment 430 arranged in the first direction can be smaller than the line width of the gate line 320, and the line width of the plurality of connection segment 330 arranged in the second direction can be smaller than the summation of the line width (d1) of the source line 420, the line width (d2) of the sensing conductor line 440 and the gap (d3) between the source line 420 and the sensing conductor line 440.

In the present invention, the plurality of connection segments 330 arranged in the second direction are disposed at positions same as the positions of the source lines 420 and the sensing conductor line 440 but on different layers Similarly, the plurality of sensing conductor segments 430 arranged in the first direction are disposed at positions same as the positions of the gate lines 320 but on different layers. In the prior art, the gate lines and the source lines are disposed below the opaque lines. In the present invention, the plurality of connection segments 330 arranged in the second direction are disposed at positions corresponding to the positions of the plurality of source lines 420 and the plurality of sensing conductor lines 440, and the plurality of sensing conductor segments 430 arranged in the first direction are disposed at positions corresponding to the positions of the plurality of gate lines 320. That is, the plurality of opaque lines 250 of the black matrix layer 140 are disposed at positions corresponding to the positions of the plurality of gate lines 320 and the plurality of source lines 420 and sensing conductor lines 440. Therefore, the plurality of connection segments 330 arranged in the second direction and the plurality of sensing conductor segments 430 arranged in the first direction are also shielded by the plurality of opaque lines 250. That is, when viewing from the upper substrate 110 to the lower substrate 120, the sensing conductor segments 430 arranged in the first direction, the connection segments 330 arranged in the second direction, the gate lines 320, the source lines 420, and the sensing conductor lines 440 are shielded by the opaque lines 250, so that they cannot be seen by users.

Figure 7A:
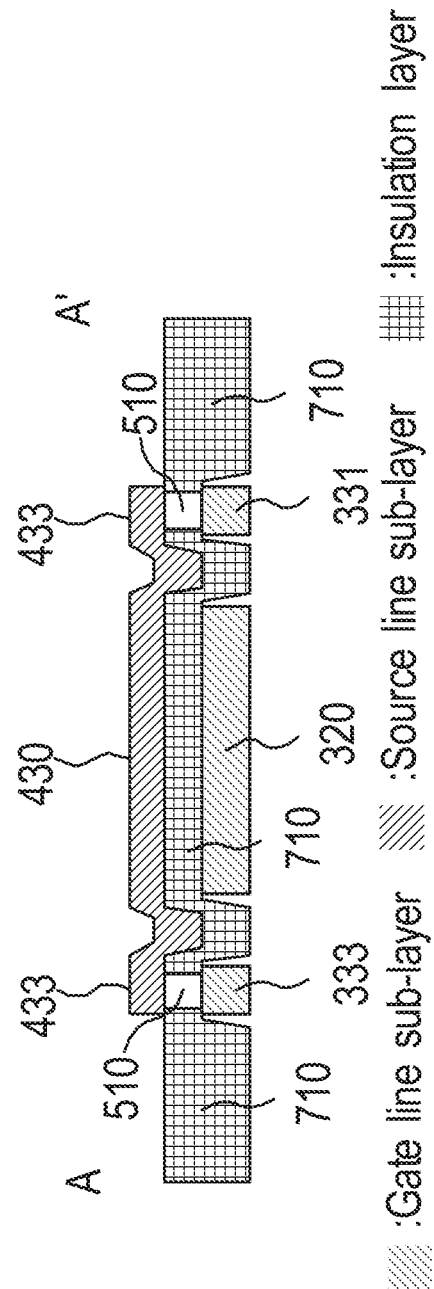
FIG. 7A and FIG. 7B are two cross sectional views taking along A-A' and B-B' lines of FIG. 6, respectively.
Figure 7B:
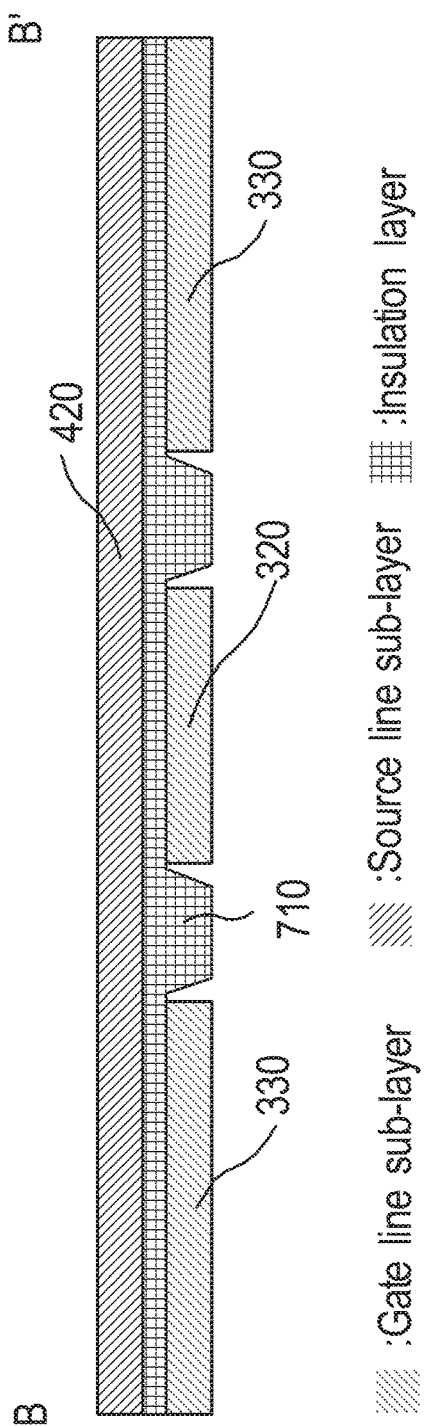

FIG. 7A and FIG. 7B are two cross sectional views taking along A-A' and B-B' lines of FIG. 6, respectively. As shown in FIG. 7A, there is an insulation layer 710 arranged between the gate line 320 and the second extension part 433 arranged in the second direction. The second extension part 433 arranged in the second direction is electrically connected to the first extension part 331 arranged in the first direction and the second extension part 333 arranged in the first direction through vias 510. There is an insulation layer 710 arranged between the gate line 320 and the source line 420.

From FIGS. 3, 4, 5, 6, 7A and 7B, it is known that the plurality of sensing conductor segments 430 and the plurality of connection segments 330 arranged in the second direction can form the plurality of sensing conductor blocks 520 arranged in the first direction. Further, with the plurality of sensing conductor lines 440 used as a plurality of sensing conductor lines arranged in the second direction, it is able to form a touch pattern with the sensing conductor blocks arranged in the first direction and the sensing conductor lines arranged in the second direction, so as to detect finger's touch.

Figure 8:
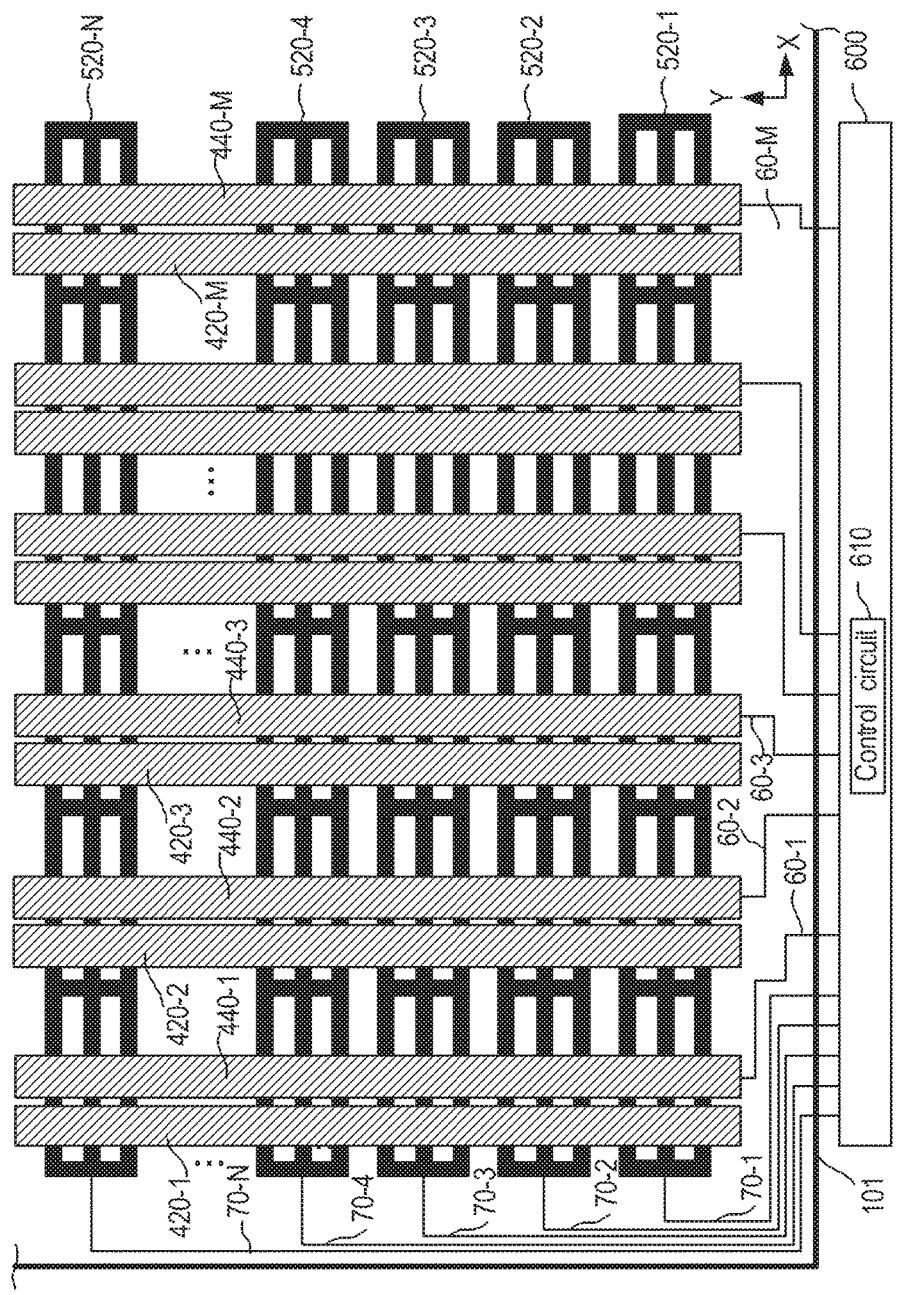
FIG. 8 is a schematic diagram of the sensing conductor in accordance with the present invention

FIG. 8 is a schematic diagram of the sensing conductor in accordance with the present invention, which includes a plurality of sensing conductor blocks 520 arranged in the first direction and a plurality of sensing conductor lines 440 arranged in the second direction. The plurality of sensing conductor lines 440-1, 440-2, . . . , 440-M arranged in the second direction are extended to one edge 101 of the in-cell touch display structure 100 through the wires 60-1, 60-2, . . . , 60-M, and further connected to the control circuit 610 of a flexible circuit board 600.

The plurality of sensing conductor blocks 520-1, 520-2, . . . , 520-N arranged in the first direction are extended to the edge 101 of the in-cell touch display structure 100 through the wires 70-1, 70-2, . . . , 70-N, and further connected to the control circuit 610 of the flexible circuit board 600.

Because the plurality of sensing conductor segments 430 are disposed at positions corresponding to the positions of the gate lines 320, and the plurality of connection segments 330 arranged in the second direction are disposed at positions corresponding to the positions of the source lines 420 and the sensing conductor lines 440, the plurality of sensing conductor blocks 520-1, 520-2, . . . , 520-N arranged in the first direction formed thereby are disposed at positions corresponding to the gate lines 320, the source lines 420 and the sensing conductor lines 440, and thus can be shielded by the plurality of opaque lines 250. As a result, the light penetration rate is not influenced.

Each of the sensing conductor blocks 520-1, 520-2, . . . , 520-N is formed with a mesh-like quadrangular region, wherein the slender metal sensing lines in each quadrangular region are electrically connected with each other while any two quadrangular regions are not connected with each other.

The control circuit 610 is connected to the plurality of gate lines 320, the plurality of source lines 420, the plurality of sensing conductor blocks 520 arranged in the first direction, and the plurality of sensing conductor lines 440 arranged in the second direction. In sensing, the control circuit 610 provides touch driving signals for detecting whether there is an external object approached through the plurality of sensing conductor lines 440 arranged in the second direction and the plurality of sensing conductor blocks 520 arranged in the first direction.

Figure 9:
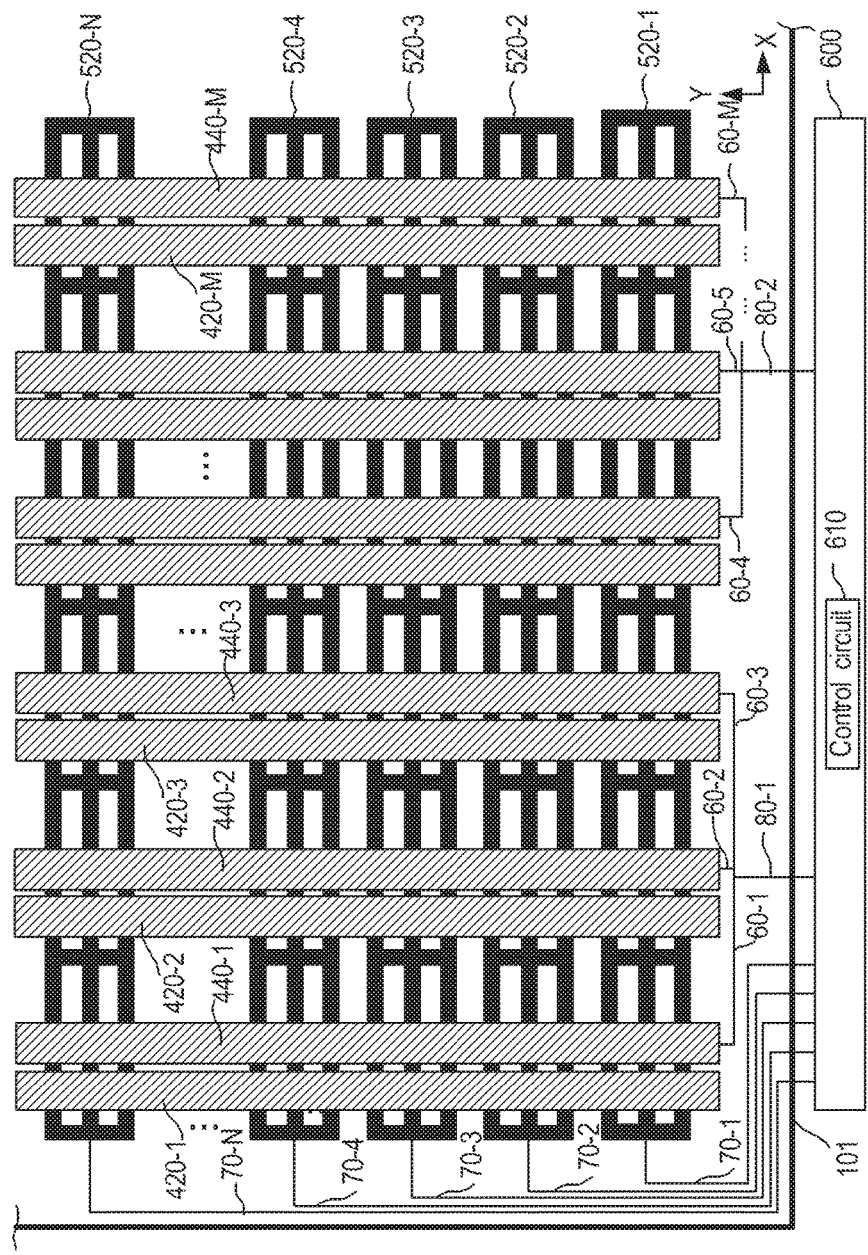
FIG. 9 is another schematic diagram of the sensing conductor in accordance with the present invention.

FIG. 9 is another schematic diagram of the sensing conductor in accordance with the present invention, which is similar to FIG. 8 except that, in FIG. 9, three sensing conductor lines 440-1, 440-2 and 440-3 arranged in the second direction are electrically connected together through wires 60-1, 60-2 and 60-3 and then extended to the edge 101 of the in-cell touch display structure 100 through a wire 80-1 for being further connected to the control circuit 610 of the flexible circuit board 600. That is, a plurality of sensing conductor lines 440 arranged in the second direction can be connected together first for use as a sensing electrode so as to increase the sensing area of a single sensing electrode, thereby allowing the control circuit 610 to easily detect a touch.

The color filter layer 160 is arranged on one side of the black matrix layer 140 that faces the display material layer 130. The common electrode layer 180 is disposed between the upper substrate 110 and the lower substrate 120. The upper polarizer layer 190 is arranged on one side the upper substrate 110 opposite to the other side of the upper substrate 110 facing the display material layer 130. The lower polarizer layer 200 is arranged on one side of the lower substrate 120 opposite to the other side of the lower substrate 120 facing the display material layer 130.

Figure 10:
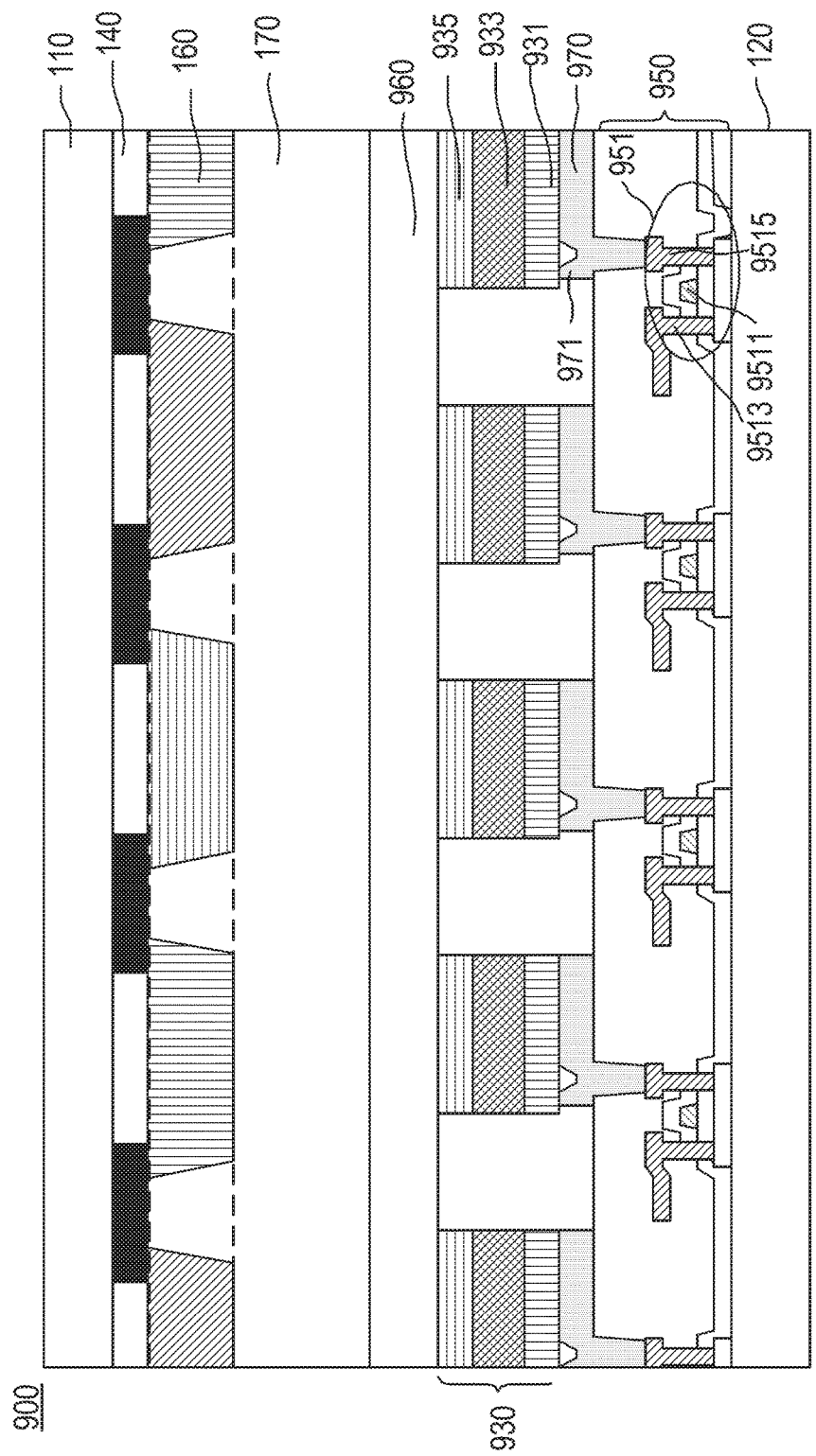
FIG. 10 is a stack-up diagram of the in-cell touch display structure in accordance with another embodiment of the present invention.

FIG. 10 is a stack-up diagram of the in-cell touch display structure in accordance with another embodiment of the present invention. As shown, the in-cell touch display structure 900 includes an upper substrate 110, a lower substrate 120, a display material layer 930, a black matrix layer 140, a thin film transistor and sensing electrode layer 950, a color filter layer 160, an overcoat layer 170, a cathode layer 960, and an anode layer 970.

FIG. 10 is similar to FIG. 1 except for the display material layer 930, the cathode layer 960, the anode layer 970, and the thin film transistor and sensing electrode layer 950.

The upper substrate 110 and the lower substrate 120 are preferably glass substrates or plastic substrates and are parallel to each other. The display material layer 930 is disposed between the upper and lower substrates 110, 120, wherein the display material layer 930 is preferably an organic light emitting diode (OLED) layer.

In this embodiment, a plurality of sensing conductor segments 430, a plurality of sensing conductor lines 440, and a plurality of connection segments 330 are provided on the prior thin film transistor layer, and part of the plurality of sensing conductor segments 430 is electrically connected to part of the plurality of connection segments 330 to form a plurality of sensing conductor blocks 520 arranged in a first direction (X-axis direction), while a plurality of sensing conductor lines 440 are provided to form a plurality of sensing conductor lines arranged in a second direction (Y-axis direction), thereby forming the thin film transistor and sensing electrode layer 950 in accordance with the present invention. Therefore, there is no need to arrange a sensing electrode layer made of transparent material on the upper glass substrate or the lower glass substrate of a display panel, so as to reduce the manufacturing cost, simplify the manufacturing process and increase the yield rate.

The details for the plurality of sensing conductor segments 430, the plurality of sensing conductor lines 440 and the plurality of connection segments 330 can be found in the disclosure of the first embodiment and FIGS. 3-8, and thus a detailed description therefor is deemed unnecessary.

The thin film transistor and sensing electrode layer 950 is disposed on one side of the lower substrate 120 that faces the display material layer 930. The thin film transistor and sensing electrode layer 950 includes a plurality of gate lines (not shown), a plurality of source lines (not shown), a plurality sensing conductor blocks (not shown) arranged in the first direction, a plurality of sensing conductor lines 440 arranged in the second direction, and a plurality of pixel driving circuits 951, each corresponding to a pixel, so as to drive a corresponding pixel driving circuit 951 based on a display pixel signal and a display driving signal thereby performing a display operation.

According to different designs of the pixel driving circuit 951, such as 2T1C being a pixel driving circuit formed with two thin film transistors and a storage capacitor, and 6T2C being a pixel driving circuit formed with six thin film transistors and two storage capacitors, the gate 9511 of at least one thin film transistor in the pixel driving circuit 951 is connected to a gate line (not shown). According to different designs of driving circuit, a source/drain 9513 of at least one thin film transistor in a control circuit is connected to a source line (not shown) and a source/drain 9515 of at least one thin film transistor in pixel driving circuit 951 is connected to a corresponding anode pixel electrode 971 of the anode layer 970.

The cathode layer 960 is disposed at one side of the upper substrate 110 facing the display material layer 930 and between the upper substrate 110 and the display material layer 930. The cathode layer 960 is formed with metal material, preferably metal material with thickness being less than 50 nm. The metal material is selectively to be alloy of aluminum, silver, magnesium, calcium, potassium, lithium, indium, or combination of lithium fluoride, magnesium fluoride, lithium oxide and aluminum. Due to the thickness of the cathode layer 960 being less than 50 nm, the light generated by the display material layer 930 can pass through the cathode layer 960, so as to show images on the upper substrate 110. The cathode layer 960 is intact piece electrical connection, so that it can be used as a shielding. Moreover, the cathode layer 960 also receives the current coming from the anode pixel electrode 971.

The anode layer 970 is disposed at one side of the thin film transistor and sensing electrode layer 950 facing the display material layer 930. The anode layer 970 includes a plurality of anode pixel electrodes 971. Each of the anode pixel electrodes 971 is corresponding to one pixel driving transistor of the pixel driving circuit 951 of the thin film transistor and sensing electrode layer 950. That is, each of the anode pixel electrodes is connected to a source/drain of the pixel driving transistor of the corresponding pixel driving circuit 951, so as to form a pixel electrode of a specific color, for example a red pixel electrode, a green pixel electrode, or a blue pixel electrode.

The display material layer 930 includes a hole transporting layer 931, an emitting layer 933, and an electron transporting layer 935. The display material layer 930 is preferably emitting white light, and using the color filter layer 160 to filter out and to generate red, blue, green primary colors.

Figure 11:
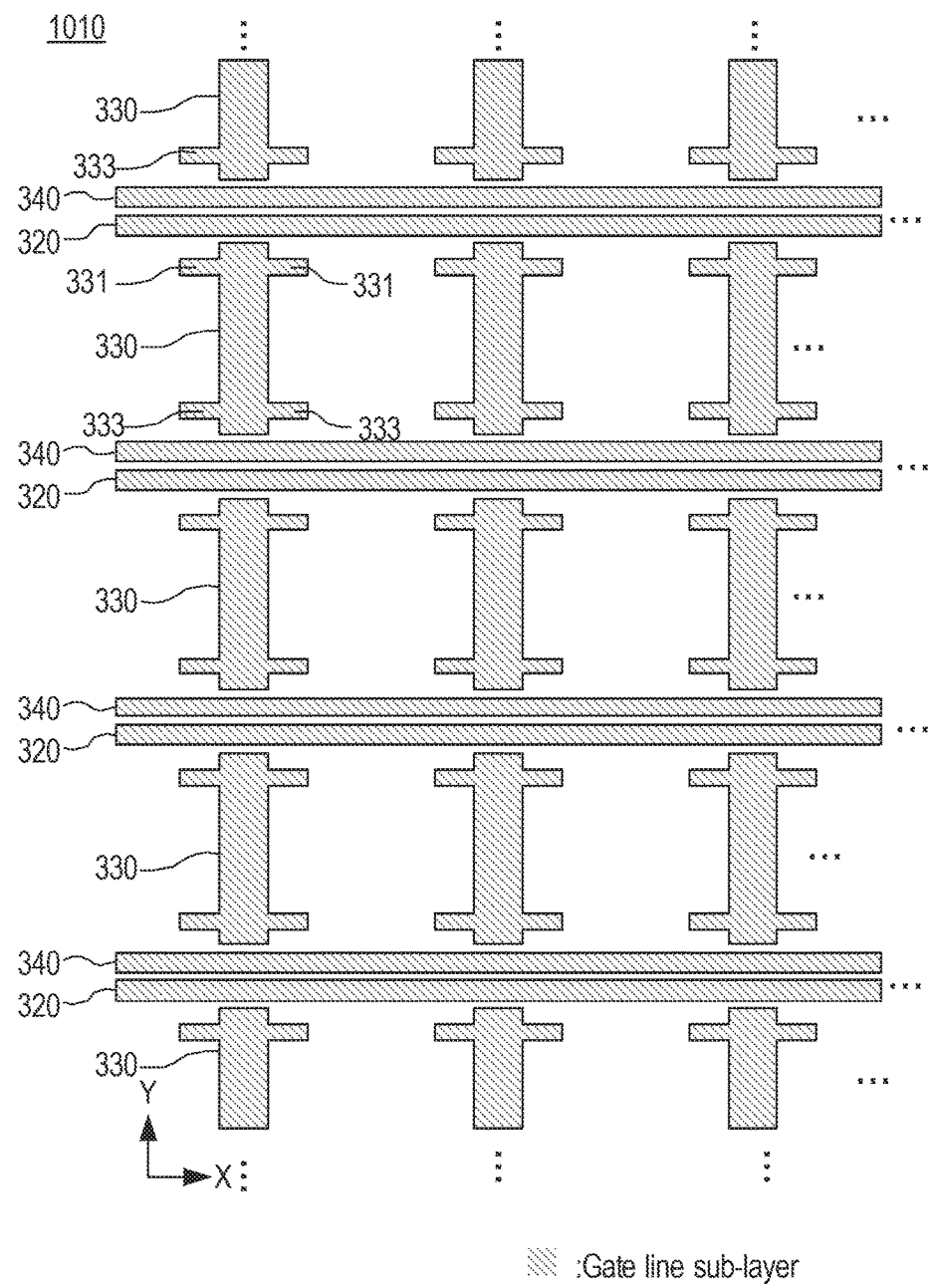
FIG. 11 is another schematic diagram of the gate line sub-layer in accordance with the present invention.
Figure 12:
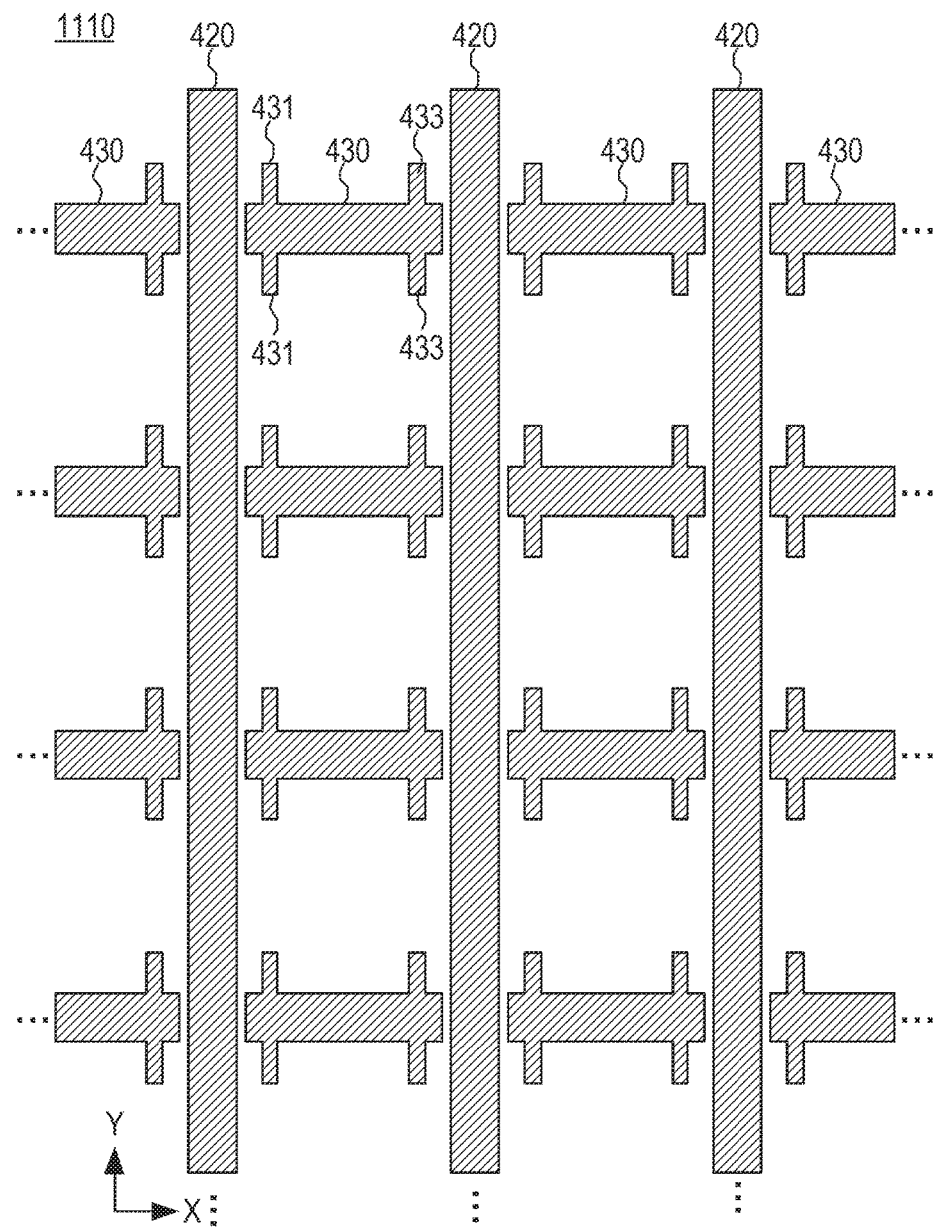
FIG. 12 is another schematic diagram of the source line sub-layer in accordance with the present invention.

FIG. 11 is another schematic diagram of the gate line sub-layer in accordance with the present invention. FIG. 12 is another schematic diagram of the source line sub-layer in accordance with the present invention. The gate line sub-layer 1010 of FIG. 11 and the source line sub-layer 1110 of FIG. 12 are similar to the gate line sub-layer 310 of FIG. 3 and the source line sub-layer 410 of FIG. 4 except that the plurality of sensing conductor lines 440 of FIG. 4 are removed so as to form the source line sub-layer 1110 of FIG. 12, and the plurality of sensing conductor lines 340 are provided on the gate line sub-layer 310 of FIG. 3 so as to form the gate line sub-layer 1010 of FIG. 11.

That is, the gate line sub-layer 1010 has a plurality of gate lines 320, a plurality of sensing conductor lines 340, and a plurality of connection segments 330. The plurality of gate lines 320 are arranged in the first direction. The plurality of sensing conductor lines 340 are arranged in the first direction and in parallel with the plurality of gate lines 320. The plurality of connection segments 330 are arranged in the second direction. The plurality of connection segments 330 arranged in the second direction are separated by the plurality of gate lines 320 and the plurality of sensing conductor lines 340.

The gate line sub-layer 1010 of FIG. 11 and the source line sub-layer 1110 of FIG. 12 can be applied in an in-cell touch display structure in which the display material layer is either a liquid crystal layer or an OLED layer. The details can be found in the disclosure of the first embodiment and FIGS. 3-8, and thus a detailed description therefor is deemed unnecessary.

Figure 13:
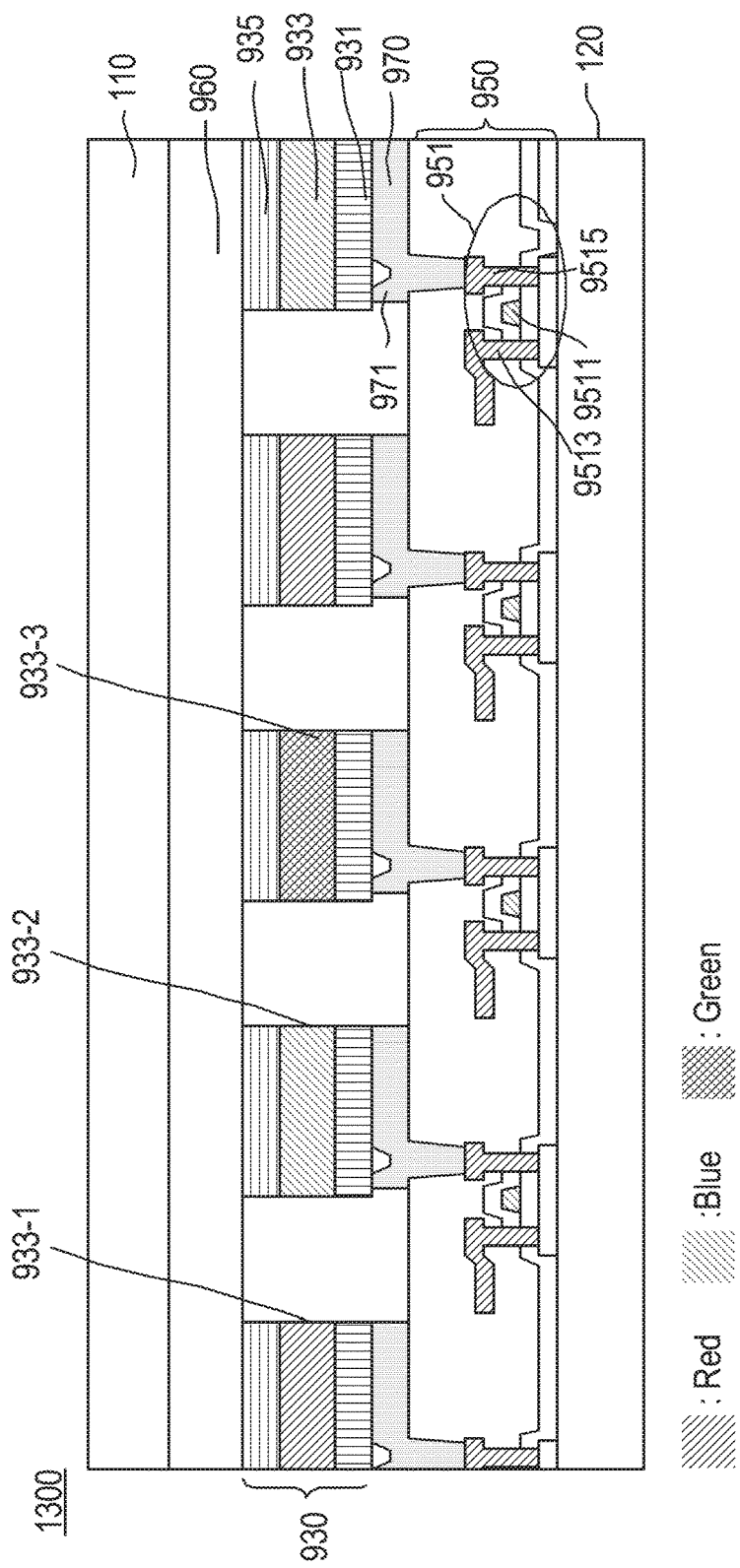
FIG. 13 is a stack-up diagram of the in-cell touch display structure in accordance with still another embodiment of the present invention.

FIG. 13 is a stack-up diagram of the in-cell touch display structure in accordance with still another embodiment of the present invention. As shown, the in-cell touch display structure 1300 includes an upper substrate 110, a lower substrate 120, a display material layer 930, a thin film transistor and sensing electrode layer 950, a cathode layer 960, and an anode layer 970. FIG. 13 is similar to FIG. 10 except that, in FIG. 13, a red light emitting layer 933-1, a blue light emitting layer 933-2 and a green light emitting layer 933-3 are employed so that there is no need to use the black matrix layer 140, the color filter layer 160 and the over coat layer 170.

In the prior art, the electrode pads made of ITO have an average light penetration rate of about 90%. In the present invention, the sensing conductor lines 440, the sensing conductor lines 340 and the plurality of sensing conductor blocks 520 arranged in the first direction are disposed at positions corresponding to the positions of the gate lines and the source lines, so that the light penetration rate is not influenced. Therefore, the light penetration rate of the present invention is much better than that of the prior art. Accordingly, in comparison with the prior touch display panel, the in-cell touch display structure in accordance with the present invention shall have a higher brightness.

In view of the forgoing, it is known that the present invention is able to form the sensing conductor blocks 520 arranged in the first direction and the sensing conductor lines 440 arranged in the second direction or the sensing conductor blocks arranged in the second direction and the sensing conductor lines 340 arranged in the first direction on the thin film transistor and sensing electrode layer 150, so that there is no need to manufacture a sensing electrode layer made of ITO material on the upper glass substrate or lower glass substrate of the display panel thereby reducing the manufacturing cost and decreasing the manufacturing process.

Moreover, the plurality of connection segments 330 arranged in the second direction of the present invention can also be defined on the mask for defining the prior gate lines 320, and the plurality of sensing conductor segments 430 arranged in the first direction of the present invention can also be defined on the mask for defining the prior source lines 420. Therefore, there is no extra manufacturing process required; i.e., the display panel is provided with touch control function without introducing new process.

Although the present invention has been explained in relation to its preferred embodiment, it is to be understood that many other possible modifications and variations can be made without departing from the spirit and scope of the invention as hereinafter claimed.

What is claimed is:

1. An in-cell touch display structure, comprising:
   an upper substrate;
   a lower substrate parallel to the upper substrate;
   a display material layer configured between the upper substrate and the lower substrate;
   a thin film transistor and sensing electrode layer arranged on one side of the lower substrate facing the display material layer for driving a corresponding pixel driving circuit based on a display pixel signal and a display driving signal, wherein the thin film transistor and sensing electrode layer includes:
   a gate line sub-layer having a plurality of gate lines arranged in a first direction, a plurality of sensing conductor lines arranged in the first direction and in parallel with the plurality of gate lines, and a plurality of sensing conductor segments arranged in a second direction, the plurality of sensing conductor segments arranged in the second direction being separated by the plurality of gate lines and the plurality of sensing conductor lines; and
   a source line sub-layer arranged at one side of the gate line sub-layer facing the display material layer and having a plurality of source lines arranged in the second direction and a plurality of connection segments arranged in the first direction, the plurality of connection segments arranged in the first direction being separated by the plurality of source lines,
   wherein more than one of the sensing conductor segments and more than one of the connection segments are electrically connected together to form a plurality of sensing conductor blocks arranged in the second direction, and the sensing conductor blocks are not electrically connected to the sensing conductor lines;
   wherein, in sensing, the plurality of sensing conductor lines arranged in the first direction for use as sensing electrodes and the plurality of sensing conductor blocks arranged in the second direction for use as transmitting electrodes are provided to detect whether there is an external object approached or touched.

2. The in-cell touch display structure as claimed in claim 1, wherein the plurality of sensing conductor segments, the plurality of connection segments, and the plurality of sensing conductor lines are made of conductive metal material.

3. The in-cell touch display structure as claimed in claim 2, wherein the metal material is selectively to be chromium, barium, aluminum, silver, copper, titanium, nickel, tantalum, cobalt, tungsten, magnesium, calcium, potassium, lithium, indium, or a mixture of LiF, MgF2 or Li2O.

4. The in-cell touch display structure as claimed in claim 3, wherein each of the sensing conductor blocks arranged in the second direction is a mesh-like quadrangular region, and the quadrangular region is of a rectangle.

5. The in-cell touch display structure as claimed in claim 4, wherein each of the plurality of connection segments arranged in the first direction includes two ends respectively having a first extension part and a second extension part arranged in the second direction, and each of the plurality of sensing conductor segments arranged in the second direction includes two ends respectively having a first extension part and a second extension part arranged in the first direction, the extension parts being partially overlapped.

6. The in-cell touch display structure as claimed in claim 5, wherein the extension parts are partially overlapped for being electrically connected, and the plurality of connection segments arranged in the first direction and the plurality of sensing conductor segments arranged in the second direction are provided to form the plurality of sensing conductor blocks arranged in the second direction of the thin film transistor and sensing electrode layer.

7. The in-cell touch display structure as claimed in claim 1, wherein the plurality of sensing conductor segments and the plurality of connection segments are disposed at positions corresponding to those of the plurality of gate lines, and the plurality of sensing conductor lines and the plurality of source lines.

8. The in-cell touch display structure as claimed in claim 1, wherein the display material layer is a liquid crystal layer.

9. The in-cell touch display structure as claimed in claim 1, wherein the display material layer is an OLED layer.

10. The in-cell touch display structure as claimed in claim 1, wherein the first direction is vertical to the second direction.

* * * * *